United States Patent
Hyakutake et al.

(10) Patent No.: US 8,882,961 B2
(45) Date of Patent: Nov. 11, 2014

(54) SUBSTRATE TREATMENT APPARATUS

(75) Inventors: Hironobu Hyakutake, Koshi (JP); Koji Yamashita, Koshi (JP); Shingo Kamitomo, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 608 days.

(21) Appl. No.: 13/127,571

(22) PCT Filed: Nov. 6, 2009

(86) PCT No.: PCT/JP2009/068974
§ 371 (c)(1),
(2), (4) Date: Jul. 6, 2011

(87) PCT Pub. No.: WO2010/053149
PCT Pub. Date: May 14, 2010

(65) Prior Publication Data
US 2011/0259521 A1 Oct. 27, 2011

(30) Foreign Application Priority Data
Nov. 7, 2008 (JP) .................. 2008-286543

(51) Int. Cl.
*C23F 1/08* (2006.01)
*C23F 1/00* (2006.01)
*B01D 53/78* (2006.01)
*B01D 53/18* (2006.01)
*H01L 21/67* (2006.01)

(52) U.S. Cl.
CPC .......... *B01D 53/78* (2013.01); *B01D 2252/103* (2013.01); *H01L 21/67017* (2013.01); *B01D 53/185* (2013.01); *B01D 2258/0216* (2013.01)

USPC ................................ 156/345.18

(58) Field of Classification Search
USPC ................................ 156/345.18
See application file for complete search history.

(56) References Cited

U.S. PATENT DOCUMENTS

2007/0036694 A1 2/2007 Nishioka et al.
2011/0259521 A1* 10/2011 Hyakutake et al. ...... 156/345.29

FOREIGN PATENT DOCUMENTS

JP        63042720 A * 2/1988
JP        2002-110621 A1 4/2002

(Continued)

OTHER PUBLICATIONS

Taiwanese Office Action dated Nov. 16, 2012.

(Continued)

*Primary Examiner* — Sylvia R MacArthur
(74) *Attorney, Agent, or Firm* — Burr & Brown, PLLC

(57) ABSTRACT

The density of a treatment fluid in exhaust gas is reduced, the amount of the treatment fluid that flows into exhausting equipment connected to a substrate treatment apparatus is reduced, and a load on the exhausting equipment is reduced. A substrate treatment apparatus includes: a substrate treating unit that treats a substrate; a treatment fluid supply unit that supplies, to the substrate treating unit, a treatment fluid used to treat the substrate; and an exhaust gas treating unit into which an exhaust gas containing the treatment fluid discharged from the substrate treating unit is introduced. The exhaust gas treating unit includes spray nozzles that spray a solvent toward the exhaust gas, the solvent dissolving the treatment fluid, thereby reducing the density of the treatment fluid in the exhaust gas. The exhaust gas treating unit has porous dispersion plates that cause the exhaust gas to disperse.

10 Claims, 4 Drawing Sheets

(56) References Cited

FOREIGN PATENT DOCUMENTS

| | | | |
|---|---|---|---|
| JP | 2002-301332 A1 | 10/2002 | |
| JP | 2006-210839 A1 | 8/2006 | |
| JP | 2006-216803 A1 | 8/2006 | |
| JP | 2007-032472 A1 | 2/2007 | |
| JP | 2007-218192 A1 | 8/2007 | |
| JP | 2007-273819 A1 | 10/2007 | |
| TW | M325867 U | 1/2008 | |

OTHER PUBLICATIONS

Japanese Office Action and File History Information dated Apr. 16, 2012 (with English translation).

Japanese Office Action (Application No. 2012-165144) dated Oct. 1, 2013.

* cited by examiner

SUBSTRATE TREATMENT APPARATUS

BACKGROUND OF THE INVENTION

1. Technical Field

The present invention relates to a substrate treatment apparatus that performs treatments, such as etching, cleaning and drying, on a substrate for a semiconductor part, a flat display or the like.

2. Description of Related Art

For the manufacture of semiconductor parts, a flat displays or the like, a substrate treatment apparatus has been conventionally used which performs various treatments, such as etching, cleaning and drying, on a substrate such as a semiconductor wafer or a liquid crystal substrate.

For example, a substrate treatment apparatus cleans a semiconductor wafer and then dries the surface of the semiconductor wafer. Such a substrate treatment apparatus includes substrate treating unit that treats the semiconductor wafer serving as a substrate; a treatment fluid supply unit that supplies, to the substrate treating unit, vapor of isopropyl alcohol (IPA) that serves as a treatment fluid used to dry the substrate; and a drain treating unit that separates and removes moisture from exhaust gas discharged from the substrate treating unit.

The conventional substrate treatment apparatus dries the substrate in such a manner that vapor of the IPA is sprayed onto the substrate, the IPA is dissolved in water droplets attached to the surface of the substrate and the water droplets are separated from the substrate. After that, the drain treating unit separates a liquid from exhaust gas discharged out of the substrate treating unit. The IPA dissolved in the water is discharged as a waste liquid, while the exhaust gas is discharged to the outside through exhausting equipment (for example, refer to Patent Document 1).

PRIOR ART LITERATURE

Patent Document

Patent Document 1: JP-A-2002-110621

SUMMARY OF THE INVENTION

Problems to be Solved by the Invention

The conventional substrate treatment apparatus, however, simply includes the drain treating unit that separates and removes moisture from the exhaust gas discharged out of the substrate treating unit. Thus, although a treatment fluid (IPA) dissolved in water is treated as a waste liquid, a treatment fluid (IPA) that is not dissolved in water and exists as gas is transferred to the exhausting equipment as it is.

Thus, for the conventional substrate treatment apparatus, the treatment fluid flows into the exhausting equipment provided for treating exhaust gas and thereby contaminates the exhausting equipment. In addition, it is necessary to separately treat the treatment fluid in the exhausting equipment. These result in an increase in load on the exhausting equipment.

Means for Solving the Problems

The present invention provides a substrate treatment apparatus comprising: a substrate treating unit that treats a substrate; a treatment fluid supply unit that supplies, to the substrate treating unit, a treatment fluid used to treat the substrate; and an exhaust gas treating unit into which an exhaust gas containing the treatment fluid discharged from the substrate treating unit is introduced, the exhaust gas treating unit including a spray nozzle for spraying a solvent toward the exhaust gas, the solvent dissolving the treatment fluid, thereby reducing the density of the treatment fluid contained in the exhaust gas.

The present invention provides the substrate treatment apparatus, wherein the spray nozzle includes a first spray nozzle, the first spray nozzle spraying the solvent toward the exhaust gas introduced into the exhaust gas treating unit in a direction perpendicular to the direction of flow of the exhaust gas.

The present invention provides the substrate treatment apparatus, wherein the spray nozzle further includes a second spray nozzle, the second spray nozzle spraying the solvent toward the exhaust gas introduced into the exhaust gas treating unit in a direction parallel to the direction of the flow of the exhaust gas.

The present invention is the substrate treatment apparatus, wherein the exhaust gas treating unit includes a porous dispersion plate that causes the exhaust gas to disperse.

The present invention is the substrate treatment apparatus, wherein the spray nozzle sprays at least a part of the solvent toward the dispersion plate.

The present invention is the substrate treatment apparatus, wherein the spray nozzle is arranged in the vicinity of an exhaust gas inlet port from which the exhaust gas is introduced into the exhaust gas treating unit.

The present invention provides the substrate treatment apparatus, wherein the exhaust gas treating unit includes: an exhaust gas treatment flow path in which the exhaust gas is introduced, and the spray nozzle sprays the solvent toward the introduced exhaust gas; and an exhaust gas upward flow path that is located on the downstream side of the exhaust gas treatment flow path in which the exhaust gas flows from a bottom side to a top side.

The present invention provides the substrate treatment apparatus that further includes a gas-liquid separation filter that is arranged in the exhaust gas upward flow path.

The present invention provides the substrate treatment apparatus, wherein the exhaust gas upward flow path has a cross-sectional area larger than that of the exhaust gas treatment flow path such that the flow velocity of the exhaust gas in the exhaust gas upward flow path is lower than that of the exhaust gas in the exhaust gas treatment flow path.

The present invention provides the substrate treatment apparatus, wherein vapor or mist of an organic solvent is used as the treatment fluid.

The present invention provides the substrate treatment apparatus, wherein water is used as the solvent.

Effect of the Invention

According to the present invention, the density of the treatment fluid in the exhaust gas can be reduced by spraying the solvent capable of dissolving the treatment fluid from the spray nozzle toward the exhaust gas discharged from the substrate treating unit, the amount of the treatment fluid that flows into the exhausting equipment connected to the substrate treatment apparatus can be reduced, and a load on the exhausting equipment can be reduced.

DETAILED DESCRIPTION OF THE INVENTION

An embodiment of the present invention is described using a substrate treatment apparatus for performing a cleaning treatment and a drying treatment on a semiconductor wafer (substrate) as an example with reference to the accompanying drawings.

Figure 1:
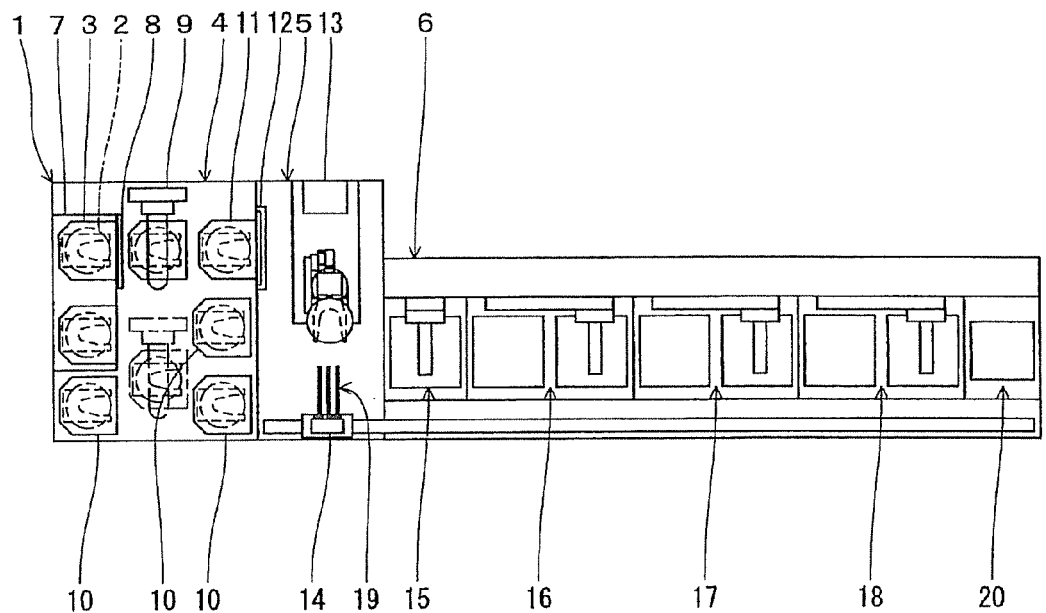
FIG. 1 is a plan view of a substrate treatment apparatus.

As shown in FIG. 1, a substrate treatment apparatus 1 includes a carrier loading/unloading unit 4 that loads and unloads a carrier 3 storing a plurality of semiconductor wafers (hereinafter referred to as "substrates 2"); a substrate loading/unloading unit 5 that loads and unloads the substrates 2 stored in the carrier 3; and a substrate treating unit 6 that performs a cleaning treatment and a drying treatment on the substrates 2.

The carrier loading/unloading unit 4 has a carrier stage 7 on which the carrier 3 is placed. A sealed opening/closing door 8 is provided on the carrier stage 7. A carrier conveying mechanism 9, a carrier stock 10 and a carrier placing table 11 are provided on the inner side of the opening/closing door 8.

The carrier loading/unloading unit 4 is operated such that the carrier 3 placed on the carrier stage 7 by the carrier conveying mechanism 9 is temporarily stored in the carrier stock 10 when necessary and loaded onto the carrier placing table 11. In addition, the carrier loading/unloading unit 4 is adapted such that the carrier 3 that stores the substrates 2 having been subjected to treatment by the substrate treating unit 6 and is placed on the carrier placing table 11 is temporarily stored in the carrier stock 10 by the carrier conveying mechanism 9 when necessary and unloaded onto the carrier stage 7 in the order opposite to that of the operation for the loading onto the carrier placing table 11.

The substrate loading/unloading unit 5 has a sealed opening/closing door 12 formed between the substrate loading/unloading unit 5 and the carrier loading/unloading unit 4. A substrate loading/unloading mechanism 13 and a front end of a substrate conveying mechanism 14 are provided on the inner side of the opening/closing door 12.

In the substrate loading/unloading unit 5, the substrates 2 that are stored by the carrier 3 placed on the carrier placing table 11 of the carrier loading/unloading unit 4 are loaded onto the substrate conveying mechanism 14 by the substrate loading/unloading mechanism 13 and conveyed to the substrate treating unit 6 by the substrate conveying mechanism 14. In contrast, the substrates 2 having been subjected to treatment by the substrate treating unit 6 are conveyed from the substrate treating unit 6 to the substrate loading/unloading mechanism 13 by the substrate conveying mechanism 14, unloaded from the substrate loading/unloading mechanism 13 and unloaded onto the carrier 3 placed on the carrier placing table 11 of the carrier loading/unloading unit 4 by the substrate loading/unloading mechanism 13.

The substrate treating unit 6 includes: a substrate cleaning/drying device 15 that performs a cleaning treatment and a drying treatment on the substrates 2; substrate cleaning devices 16, 17 and 18 that perform a cleaning treatment on the substrates 2; and a cleaning device 20 that cleans a holder 19 that is included in the substrate conveying mechanism 14 and holds the substrates 2 which are sequentially placed. The substrate conveying mechanism 14 is arranged along the devices 15, 16, 17, 18 and 20.

The substrate treating unit 6 is operated such that the substrates 2 are conveyed by the substrate conveying mechanism 14 from the substrate loading/unloading unit 5 to the substrate cleaning/drying device 15 and the substrate cleaning devices 16, 17 and 18, where the substrates 2 are subjected to the cleaning treatments and the drying treatment. After that, the substrates 2 having been subjected to the treatments are conveyed to the substrate loading/unloading unit 5 by the substrate conveying mechanism 14 again.

In the substrate treating unit 6, the cleaning device 20 cleans the holder 19 provided on the substrate conveying mechanism 14 so as to prevent a contaminant attached to the holder 19 from being transferred onto the substrates 2.

Next, the configuration of the substrate cleaning/drying device 15, which is an essential portion of the invention, is described.

Figure 2:
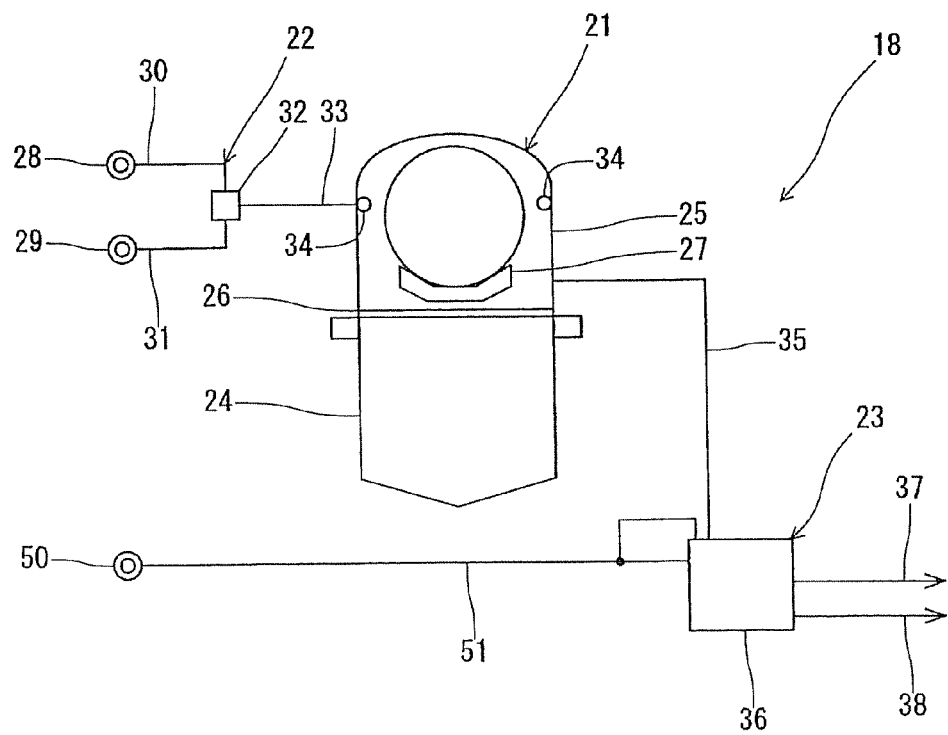
FIG. 2 is a schematic diagram showing a substrate cleaning/drying device.

As shown in FIG. 2, the substrate cleaning/drying device 15 includes: a substrate treating unit 21 that performs a cleaning treatment and a drying treatment on the substrate 2; a treatment fluid supply unit 22 that supplies, to the substrate treating unit 21, vapor of isopropyl alcohol (IPA) that serves as a treatment fluid; and an exhaust gas treating unit 23 that treats exhaust gas discharged from the substrate treating unit 21.

The substrate treating unit 21 has a hollow box-shaped cleaning tank 24 that is open at an upper end of the tank 24. A hollow box-shaped drying chamber 25 that is open at a lower end of the chamber 25 is vertically movably attached to an upper portion of the cleaning tank 24 through an opening/closing lid 26 that can slide in a left-right direction. A holder 27 that holds the substrate 2 is vertically movably provided in the cleaning tank 24 and the drying chamber 25. The substrate treating unit 21 is not limited to a unit that cleans and dries the substrate 2. The substrate treating unit 21 may be a unit that only cleans the substrate 2. In addition, the substrate treating unit 21 may be a unit that only dries the substrate 2.

The substrate treating unit 21 performs the cleaning treatment on the substrate 2 by immersing the substrate 2 held by the holder 27 in a cleaning liquid stored in the cleaning tank 24. After that, the substrate 2 is moved by the holder 27 from the cleaning tank 24 to the drying chamber 25. The substrate treating unit 21 performs the drying treatment on the substrate 2 in the drying chamber 25 using IPA vapor supplied from the treatment fluid supply unit 22.

The treatment fluid supply unit 22 includes: an IPA vapor supply source 28 that supplies IPA vapor; and a nitrogen gas supply source 29 that supplies nitrogen gas. The IPA vapor supply source 28 and the nitrogen gas supply source 29 are connected to a switching device 32 through communication pipes 30 and 31. The switching device 32 is connected to a base end of a supply pipe 33. A front end of the supply pipe 33 is connected to supply nozzles 34, 34 that are attached to an inner portion of the drying chamber 25 of the substrate treating unit 21. The treatment fluid supply unit 22 may be any unit as long as it supplies the treatment fluid used to treat the substrates 2. The treatment fluid is not limited to the IPA vapor. Vapor of an organic solvent, a liquid organic solvent, and mist of an organic solvent can be used as the treatment fluid.

The IPA vapor is supplied from the IPA vapor supply source 28 of the treatment fluid supply unit 22 into the drying chamber 25 through the supply nozzles 34, 34. The substrate 2 is subjected to the drying treatment using the IPA vapor in the drying chamber 25. After the drying treatment, the inside of the drying chamber 25 is purged by nitrogen gas supplied from the nitrogen gas supply source 29.

The exhaust gas treating unit 23 has a hollow rectangular box-shaped exhaust gas treatment chamber 36 that is connected to the drying chamber 25 of the substrate treating unit 21 through a discharge pipe 35. An exhaust gas pipe 37 and a drain pipe 38 are connected to the exhaust gas treatment chamber 36. The exhaust gas pipe 37 is connected to exhausting equipment (not shown), while the drain pipe 38 is connected to drainage equipment (not shown).

Figure 3:
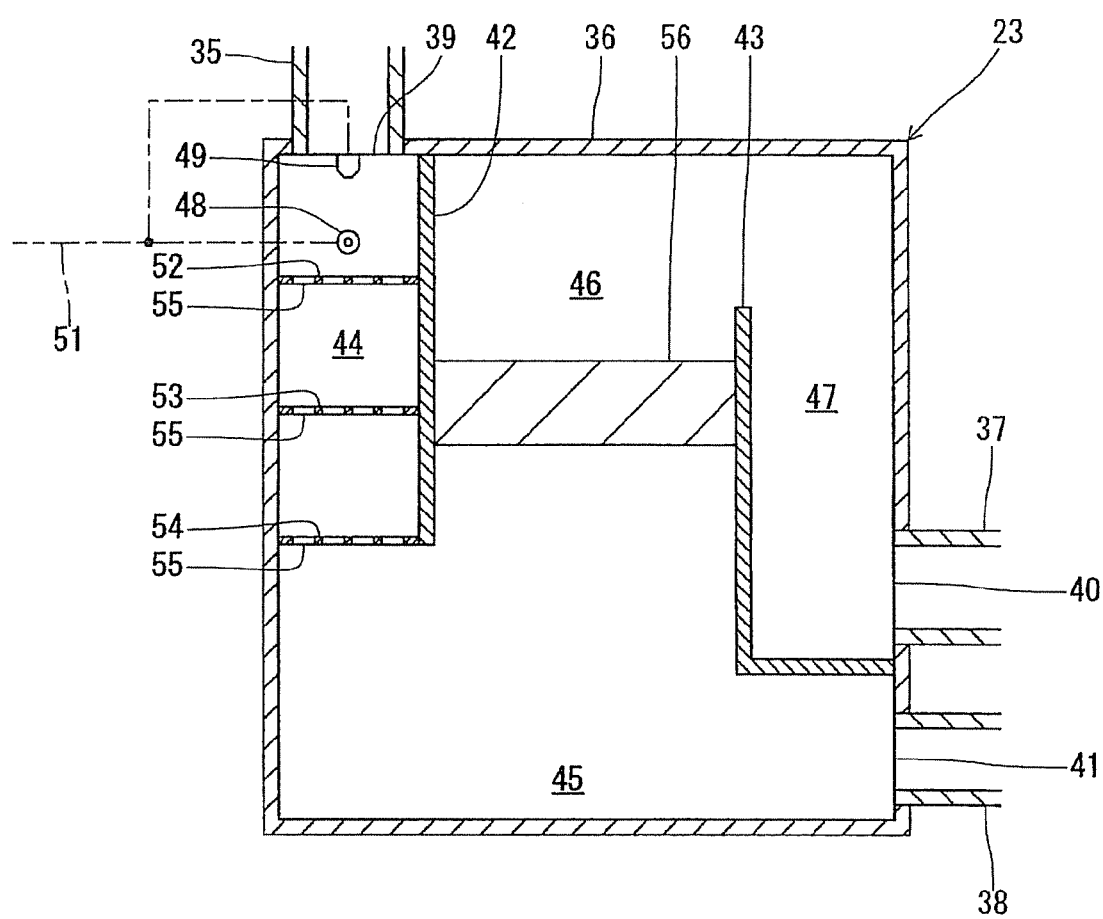
FIG. 3 is a cross-sectional front view of an exhaust gas treating unit.
Figure 4:
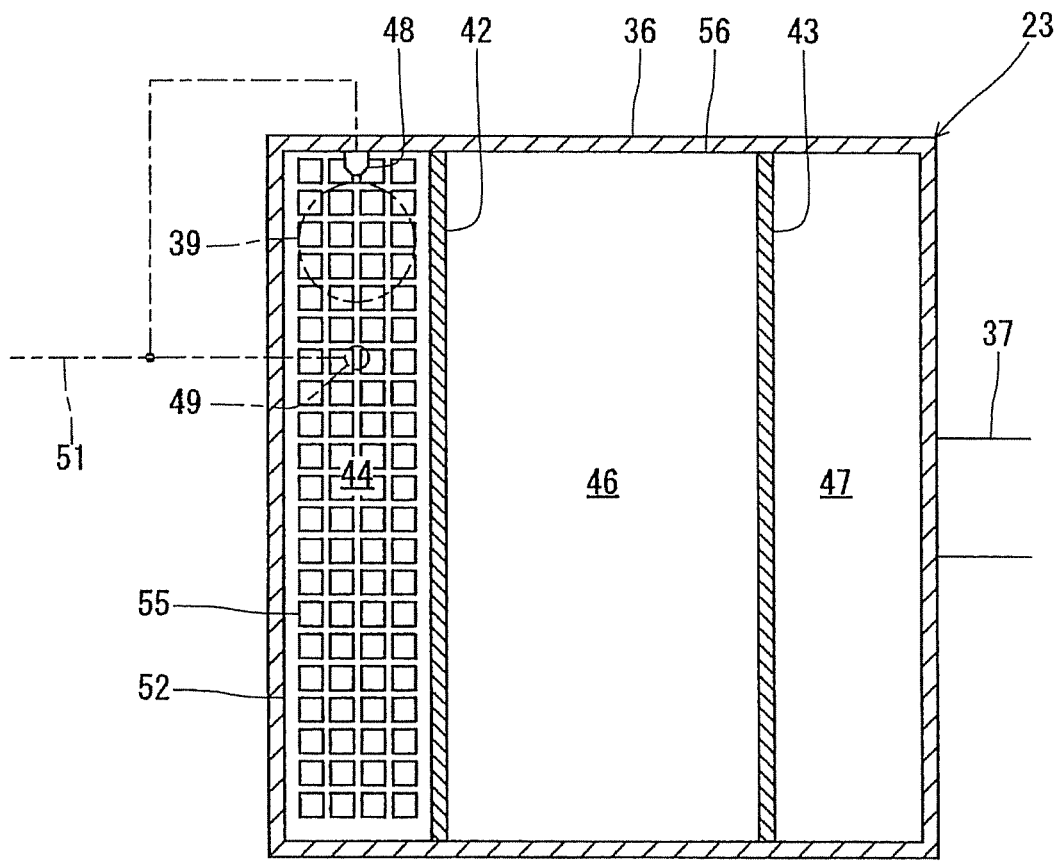
FIG. 4 is a cross-sectional plan view of the exhaust gas treating unit.
Figure 5:
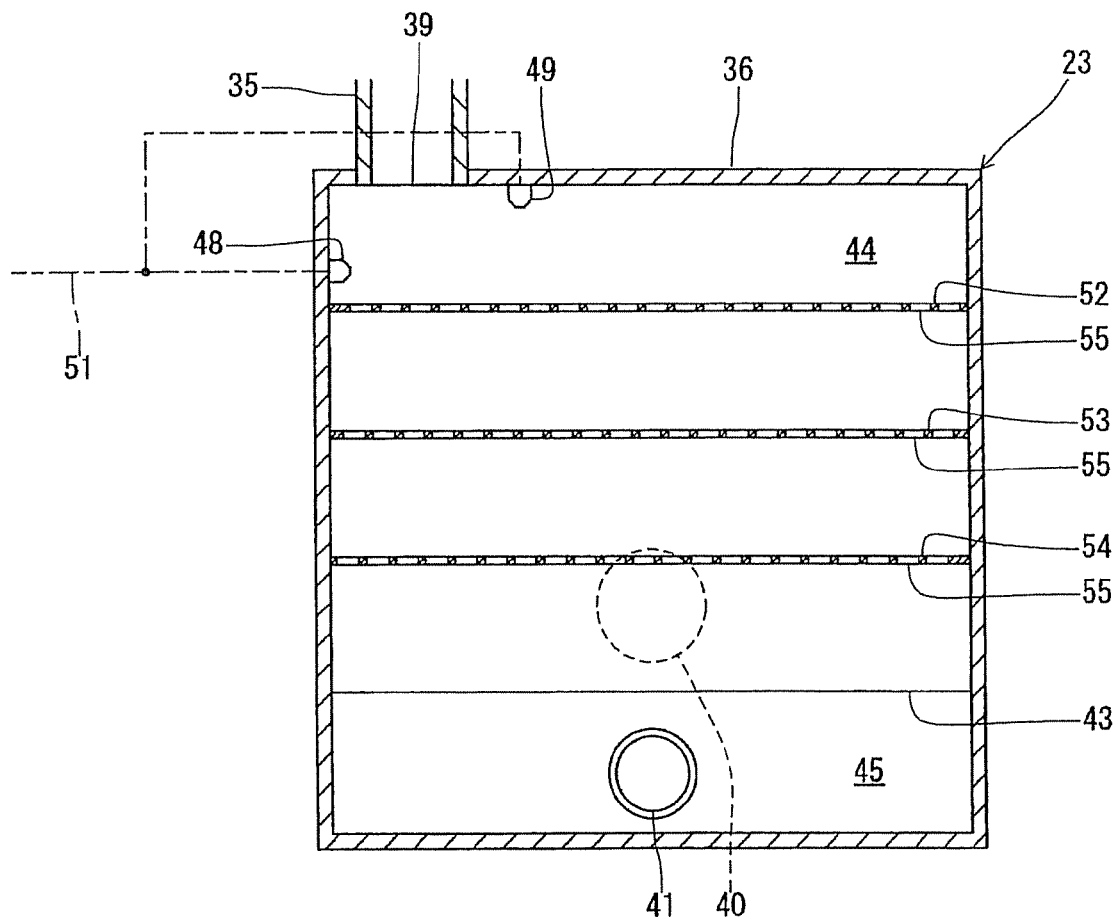
FIG. 5 is a cross-sectional side view of the exhaust gas treating unit.

The exhaust gas treatment chamber 36 has an exhaust gas inlet port 39 that is located at a top-left side back portion of the chamber 36 and connected to the discharge pipe 35 as shown in FIGS. 3 to 5. The exhaust gas treatment chamber 36 also has an exhaust gas outlet port 40 that is located at a lower right-side portion of the chamber 36 and connected to the exhaust gas pipe 37. The exhaust gas treatment chamber 36 also has a drain outlet port 41 that is located at the lower right-side portion of the chamber 36 and connected to the drain pipe 38. In addition, a partition wall 42 is provided in the vicinity of the exhaust gas inlet port 39, while a partition wall 43 is provided in the vicinity of the exhaust gas outlet port 40 and the drain outlet port 41.

Thus, the exhaust gas treatment chamber 36 is provided with the following flow paths: an exhaust gas treatment flow path 44 in which the exhaust gas flows downward from the exhaust gas inlet port 39; a drain flow path 45 in which a liquid (waste liquid) that is introduced from the exhaust gas treatment flow path 44 flows toward the drain outlet port 41 in a direction from the left side to the right side; an exhaust gas upward flow path 46 in which the gas (exhaust gas) that is introduced from the exhaust gas treatment flow path 44 flows in a direction from the bottom side to the top side; and an exhaust gas flow path 47 in which the gas (exhaust gas) that is introduced from the exhaust gas upward flow path 46 flows toward the exhaust gas outlet port 40 in a direction from the top side to the bottom side. The exhaust gas upward flow path 46 is adapted to have a cross-sectional area larger than that of the exhaust gas treatment flow path 44 by setting an interval between the partition walls 42 and 43 to a large value.

Two spray nozzles, first and second spray nozzles 48 and 49, are arranged in the vicinity of the exhaust gas inlet port 39 in the exhaust gas treatment flow path 44. A solvent supply source 50 is connected to the first and second spray nozzles 48 and 49 through a communication pipe 51. The spray nozzles 48 and 49 spray a solvent toward exhaust gas that has been introduced in the exhaust gas treatment chamber 36 from the exhaust gas inlet port 39. The solvent is a solvent (pure water in this case) that is capable of dissolving the treatment fluid (IPA in this case) that is used to treat the substrate 2 in the substrate treating unit 21.

In addition, three porous dispersion plates 52, 53 and 54 are provided between an inner wall of the exhaust gas treatment chamber 36 and the partition wall 42 in the exhaust gas treatment flow path 44. The porous dispersion plates 52, 53 and 54 are arranged in a vertical direction, spaced apart from each other, and horizontally oriented. Each of the dispersion plates 52, 53 and 54 is formed with a plurality of rectangular through holes 55. Since the through holes 55 of the dispersion plate 52 are shifted from the through holes 55 of the dispersion plate 53 in the left-right direction, and the through holes 55 of the dispersion plate 53 are shifted from the through holes 55 of the dispersion plate 54 in the left-right direction, the exhaust gas flows zigzag in the exhaust gas treatment flow path 44.

The first spray nozzle 48 is attached to a side portion of the exhaust gas treatment chamber 36 so as to spray the solvent forward in a horizontal direction that is perpendicular to the direction of flow of the exhaust gas introduced in the exhaust gas treatment chamber 36. In addition, the first spray nozzle 48 is arranged in the vicinity of the dispersion plate 52 and sprays the solvent in the direction that is parallel to the dispersion plate 52.

In addition, the second spray nozzle 49 is attached to an upper portion of the exhaust gas treatment chamber 36 so as to spray the solvent downward in a direction that is parallel to the direction of the flow of the exhaust gas introduced in the exhaust gas treatment chamber 36. Furthermore, the second spray nozzle 49 is arranged so that the sprayed solvent crosses the solvent sprayed from the first spray nozzle 48.

In addition, the spray nozzles 48 and 49 spray the solvent directly to the exhaust gas introduced from the exhaust gas inlet port 39, and a part of the sprayed solvent is sprayed directly to the dispersion plate 52 arranged in the uppermost stage (on the most upstream side).

The spray nozzles 48 and 49 may be arranged on the downstream side of the dispersion plates 52, 53 and 54. The spray nozzles 48 and 49 may be any spray nozzles as long as the spray nozzles spray the solvent. Spray nozzles that spray the solvent in a fan-shaped form can be used as the spray nozzles 48 and 49. In addition, spray nozzles that spray the solvent in a conical form can be used as the spray nozzles 48 and 49.

In addition, a gas-liquid separation filter 56 is arranged between the partition walls 42 and 43 in the exhaust gas upward flow path 46 so as to capture moisture (especially, the treatment fluid) contained in the exhaust gas flowing upward in the exhaust gas upward flow path 46.

The exhaust gas treating unit 23 has the configuration described above. The exhaust gas that is discharged from the substrate treating unit 21 during and after the treatment on the substrate 2 in the substrate treating unit 21 flows into the exhaust gas treatment chamber 36. The treatment fluid that is contained in the exhaust gas is dissolved by the solvent sprayed from the spray nozzles 48 and 49 in the exhaust gas treatment flow path 44. A waste liquid resulting from the dissolution is discharged from the drain outlet port 41 through the drain flow path 45 to the outside. In contrast, the exhaust gas flows upward in the exhaust gas upward flow path 46 and passes through the gas-liquid separation filter 56. After that, the exhaust gas passes through the exhaust gas flow path 47 and is discharged from the exhaust gas outlet port 40 to the outside.

The treatment fluid that is contained in the exhaust gas discharged from the substrate treating unit 21 is captured by the solvent in the exhaust gas treating unit 23 and treated as the waste liquid. Thus, the density of the treatment fluid in the exhaust gas can be reduced. The treatment fluid that is discharged from the substrate treating unit 21 as a liquid is directly discharged from the drain outlet port 41 as a waste liquid.

As described above, the substrate treatment apparatus 1 includes: the substrate treating unit 21 that treats the substrates 2; the treatment fluid supply unit 22 that supplies, to the substrate treating unit 21, the treatment fluid used to treat the substrates 2; and the exhaust gas treating unit 23 that includes the spray nozzles 48 and 49 for spraying the solvent that dissolves the treatment fluid toward the exhaust gas discharged from the substrate treating unit 21, and reduces the density of the treatment fluid in the exhaust gas.

Thus, the substrate treatment apparatus 1 is such that the contained treatment fluid is treated as the waste liquid during discharge by an effect of the solvent sprayed from the spray nozzles 48 and 49, and the density of the treatment fluid in the exhaust gas can be reduced. It is, therefore, possible to reduce the amount of the treatment fluid flowing into the exhausting equipment connected to the substrate treatment apparatus 1, and reduce a load on the exhausting equipment.

In addition, the substrate treatment apparatus 1 includes the first spray nozzle 48 that sprays the solvent toward the exhaust gas introduced in the exhaust gas treating unit 23 in the direction perpendicular to the flow of the exhaust gas.

In the substrate treatment apparatus 1 with the configuration described above, the solvent that is sprayed from the first spray nozzle 48 collides with the exhaust gas, so that the contact of the solvent with the exhaust gas is satisfactory. Thus, the treatment fluid that is contained in the exhaust gas can be adequately dissolved by the solvent, and the density of the treatment fluid in the exhaust gas can be reduced. Especially, when the first spray nozzle 48 is designed to spray the solvent in a conical or fan-shaped form, the first spray nozzle 48 can spray the solvent toward the exhaust gas in a planar form, so that the contact area of the solvent with the exhaust gas is increased. Therefore, the treatment fluid that is contained in the exhaust gas can be efficiently dissolved.

The substrate treatment apparatus 1 also includes the second spray nozzle 49 that sprays the solvent toward the exhaust gas (introduced in the exhaust gas treating unit 23) in the direction parallel to the direction of the flow of the exhaust gas.

Thus, in the substrate treatment apparatus 1, the solvent that is sprayed from the second spray nozzle 49 flows in the direction of the flow of the exhaust gas, so that the contact of the solvent with the exhaust gas is satisfactory. The treatment fluid that is contained in the exhaust gas can be adequately dissolved by the solvent, and the density of the treatment fluid in the exhaust gas can be reduced. Especially, when the second spray nozzle 49 is designed to spray the solvent in a conical or fan-shaped form, the second spray nozzle 49 can spray the solvent toward the exhaust gas in a planar form, so that the contact area of the solvent with the exhaust gas is increased. Therefore, the treatment fluid that is contained in the exhaust gas can be efficiently dissolved. When the solvent that is sprayed from the second spray nozzle 49 crosses the solvent sprayed from the first spray nozzle 48, the solvent can contact the exhaust gas at a high density, and whereby the treatment fluid that is contained in the exhaust gas can be efficiently dissolved. In this case, when the second spray nozzle 49 is designed to spray the solvent in a conical form, the area of the solvent that crosses the solvent sprayed from the first spray nozzle 48 is increased, and the treatment fluid that is contained in the exhaust gas can be dissolved more efficiently.

In the substrate treatment apparatus 1, the spray nozzles 48 and 49 are arranged in the vicinity of the exhaust gas inlet port 39 from which the exhaust gas flows into the exhaust gas treating unit 23.

Thus, the substrate treatment apparatus 1 is configured such that the solvent can be intensively sprayed before the exhaust gas introduced into the exhaust gas treating unit 23 disperses. Thus, the contact of the solvent with the exhaust gas is satisfactory. The treatment fluid that is contained in the exhaust gas can be adequately dissolved by the solvent, and the density of the treatment fluid in the exhaust gas can be reduced.

In addition, the substrate treatment apparatus 1 includes the porous dispersion plates 52, 53 and 54 that cause the exhaust gas to disperse in the exhaust gas treating unit 23.

Thus, the substrate treatment apparatus 1 is configured such that the contact area of the solvent with the exhaust gas is increased by causing the dispersion plates 52, 53 and 54 to disperse the exhaust gas. Thus, the contact of the solvent with the exhaust gas is satisfactory. The treatment fluid that is contained in the exhaust gas can be adequately dissolved by the solvent, and the density of the treatment fluid in the exhaust gas can be reduced.

The substrate treatment apparatus 1 is configured so that at least a part of the solvent is sprayed from the spray nozzles 48 and 49 toward the dispersion plates 52, 53 and 54.

Thus, the substrate treatment apparatus 1 is adapted, when the exhaust gas passes through the dispersion plates 52, 53 and 54, the exhaust gas directly contacts the solvent. Thus, the contact of the solvent with the exhaust gas is satisfactory. The treatment fluid that is contained in the exhaust gas can be adequately dissolved by the solvent, and the density of the treatment fluid in the exhaust gas can be reduced. Especially, when the first spray nozzle 48 is designed to spray the solvent in the direction parallel to the dispersion plate 52 and arranged near the dispersion plate 52, the first spray nozzle 48 can adequately spray the solvent toward the dispersion plate 52, the contact area of the solvent with the exhaust gas at the dispersion plate 52 is increased, and the treatment fluid can be more adequately dissolved. In this case, when the first spray nozzle 48 is designed to spray the solvent in a conical form, the first spray nozzle 48 can spray the solvent across the entire dispersion plate 52, and the treatment fluid that is contained in the exhaust gas can be dissolved more efficiently.

In addition, the substrate treatment apparatus 1 is configured such that the exhaust gas upward flow path 46 in which the exhaust gas flows from the bottom side to the top side is formed in the exhaust gas treating unit 23 and located on the downstream side of the exhaust gas treatment flow path 44 in which the spray nozzles 48 and 49 spray the solvent toward the introduced exhaust gas.

Thus, the substrate treatment apparatus 1 is adapted such that, when a mist waste liquid is contained in the exhaust gas treated in the exhaust gas treatment flow path 44 and the exhaust gas flows upward in the exhaust gas upward flow path 46, the mist waste liquid drops due to an effect of the weight of moisture and is treated as a waste liquid. Thus, the density of the treatment fluid that is contained in the exhaust gas can be reduced.

Further, in the substrate treatment apparatus 1, the exhaust gas upward flow path 46 has a cross-sectional area larger than that of the exhaust gas treatment flow path 44 such that the flow velocity of the exhaust gas in the exhaust gas upward flow path 46 is lower than that of the exhaust gas in the exhaust gas treatment flow path 44.

Thus, in the substrate treatment apparatus 1, the time for which the exhaust gas flows upward in the exhaust gas upward flow path 46 is elongated, so that a large amount of the mist waste liquid can be dropped. Thus, the density of treatment fluid in the exhaust gas can be reduced.

DESCRIPTION OF THE REFERENCE NUMERALS

1 Substrate treatment apparatus
2 Substrate
3 Carrier
4 Carrier loading/unloading unit
5 Substrate loading/unloading unit
6 Substrate treating unit
7 Carrier stage
8 Opening/closing door
9 Carrier conveying mechanism
10 Carrier stock
11 Carrier placing table
12 Opening/closing door
13 Substrate loading/unloading mechanism 14 Substrate conveying mechanism
15 Substrate cleaning/drying device
16, 17, 18 Substrate cleaning device
19 Holder
20 Cleaning device
21 Substrate treating unit
22 Treatment fluid supply unit
23 Exhaust gas treating unit
24 Cleaning tank
25 Drying chamber
26 Opening/closing lid
27 Holder
28 IPA vapor supply source
29 Nitrogen gas supply source
30, 31 Communication pipe
32 Switching device
33 Supply pipe
34 Supply nozzle
35 Discharge pipe
36 Exhaust gas treatment chamber
37 Exhaust gas pipe
38 Drain pipe
39 Exhaust gas inlet port
40 Exhaust gas outlet port
41 Drain outlet port
42, 43 Partition wall
44 Exhaust gas treatment flow path
45 Drain flow path
46 Exhaust gas upward flow path
47 Exhaust gas flow path
48, 49 Spray nozzle
50 Solvent supply source
51 Communication pipe
52, 53, 54 Dispersion plate
55 Through hole
56 Gas-liquid separation filter

The invention claimed is:

1. A substrate treatment apparatus comprising:
a substrate treating unit that treats a substrate;
a treatment fluid supply unit that supplies, to the substrate treating unit, a treatment fluid used to treat the substrate; and
an exhaust gas treating unit into which an exhaust gas containing the treatment fluid discharged from the substrate treating unit is introduced,
wherein the exhaust gas treating unit comprises an exhaust gas treatment chamber, an exhaust gas inlet port provided above the exhaust gas treatment chamber into which the exhaust gas is introduced, an exhaust gas treatment flow path provided in the exhaust gas treatment chamber into which the exhaust gas from the exhaust gas inlet port flows downward, a drain flow path provided in the exhaust gas treatment chamber and communicating with the lower part of the exhaust gas treatment flow path, in which a liquid in the exhaust gas introduced from the exhaust gas treatment flow path flows, and an exhaust gas upward flow path provided in the exhaust gas treatment chamber and communicating with the drain flow path into which the exhaust gas flows upward from a bottom side to a topside, and
wherein the exhaust gas upward flow path has a cross-sectional area larger than that of the exhaust gas treatment flow path such that the flow velocity of the exhaust gas in the exhaust gas upward flow path is lower than that of the exhaust gas in the exhaust gas treatment flow path so that a large amount of the liquid can be dropped.

2. The substrate treatment apparatus according to claim 1, wherein the spray nozzle includes a first spray nozzle, the first spray spraying the solvent toward the exhaust gas introduced into the exhaust gas treating unit in a direction perpendicular to the direction of flow of the exhaust gas.

3. The substrate treatment apparatus according to claim 2, wherein the spray nozzle further includes a second spray nozzle, the second spray nozzle spraying the solvent toward the exhaust gas introduced into the exhaust gas treating unit in a direction parallel to the direction of the flow of the exhaust gas.

4. The substrate treatment apparatus according to claim 1, wherein the exhaust gas treating unit includes a porous dispersion plate that causes the exhaust gas to disperse.

5. The substrate treatment apparatus according to claim 4, wherein the spray nozzle sprays at least a part of the solvent toward the dispersion plate.

6. The substrate treatment apparatus according to claim 1, wherein the spray nozzle is arranged in the vicinity of an exhaust gas inlet port from which the exhaust gas is introduced into the exhaust gas treating unit.

7. The substrate treatment apparatus according to claim 1, further comprising a gas-liquid separation filter arranged in the exhaust gas upward flow path.

8. The substrate treatment apparatus according to claim 1, wherein vapor or mist of an organic solvent is used as the treatment fluid.

9. The substrate treatment apparatus according to claim 1, wherein water is used as the solvent.

10. The substrate treatment apparatus according to claim 1, wherein the exhaust gas treating unit includes a spray nozzle for spraying a solvent toward the exhaust gas, the solvent dissolving the treatment fluid, thereby reducing the density of the treatment fluid contained in the exhaust gas, and
wherein the spray nozzle sprays the solvent toward the exhaust gas flowing downward in the exhaust gas treatment flow path.

* * * * *